US012628615B2

(12) United States Patent
Liu et al.

(10) Patent No.: US 12,628,615 B2
(45) Date of Patent: May 12, 2026

(54) SEMICONDUCTOR STRUCTURE

(71) Applicant: ENKRIS SEMICONDUCTOR, INC., Suzhou (CN)

(72) Inventors: Kai Liu, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 375 days.

(21) Appl. No.: 18/344,084

(22) Filed: Jun. 29, 2023

(65) Prior Publication Data

US 2024/0006219 A1     Jan. 4, 2024

(30) Foreign Application Priority Data

Jun. 30, 2022   (CN) .......................... 202221664248.4

(51) Int. Cl.
H10P 72/70          (2026.01)

(52) U.S. Cl.
CPC .......... H10P 72/74 (2026.01); H10P 72/7422 (2026.01); H10P 72/7424 (2026.01)

(58) Field of Classification Search
CPC ........ H01L 21/02365–02433; C30B 25/02–22
See application file for complete search history.

(56) References Cited

U.S. PATENT DOCUMENTS

| | | | |
|---|---|---|---|
| 2014/0342484 A1* | 11/2014 | Hertkorn ................ | C30B 23/02 |
| | | | 438/46 |
| 2019/0035628 A1* | 1/2019 | Zhang ................ | H01L 21/0245 |
| 2020/0098974 A1* | 3/2020 | Tanno ................ | H01L 23/5386 |
| 2020/0279730 A1* | 9/2020 | Nishikage ......... | H01L 21/02433 |
| 2023/0257905 A1* | 8/2023 | Kubota ................... | C30B 33/06 |
| | | | 428/76 |
| 2023/0411141 A1* | 12/2023 | Sano ................... | H01L 21/3083 |
| 2024/0387170 A1* | 11/2024 | Kubono ............ | H10D 62/8503 |

FOREIGN PATENT DOCUMENTS

KR         20180084126 A  *  7/2018  ....... H01L 21/02013

* cited by examiner

*Primary Examiner* — Evren Seven
(74) *Attorney, Agent, or Firm* — Westbridge IP LLC

(57)          ABSTRACT

Disclosed is a semiconductor structure. The semiconductor structure includes a support structure, and a first dielectric layer and a growth substrate sequentially formed on the support structure, where a gravity center of the support structure and a gravity center of the growth substrate are disposed in a staggered manner, so that the direct contact between the growth substrate and the graphite disk can be avoided, a centrifugal force on the growth substrate exerted by the graphite disk to the support structure can be transferred, thereby further ensuring a quality of the growth substrate, and significantly reducing a probability of cracking to ensure a crystal quality of a subsequent epitaxial layer. The support structure is formed at the bottom of the growth substrate, so that a mechanical strength of the semiconductor structure can be effectively improved, a stability can be enhanced, and a deformation of the semiconductor structure can be suppressed.

15 Claims, 2 Drawing Sheets

SEMICONDUCTOR STRUCTURE

CROSS-REFERENCE TO RELATED APPLICATIONS

The present disclosure claims priority to Chinese Patent Application No. 202221664248.4, filed on Jun. 30, 2022, all contents of which are incorporated herein in its entirety by reference.

TECHNICAL FIELD

The present disclosure relates to the field of semiconductor device technologies, and in particular, to a semiconductor structure.

BACKGROUND

In an epitaxial growth process of semiconductor materials, materials such as Si, SiC, and sapphire are usually selected as the material of epitaxial substrates to reduce costs. However, a difference between the epitaxial material and substrate materials leads to differences in lattice constant and thermal expansion coefficient. In addition, a graphite disk rotates fast during the epitaxial growth, the substrate is subjected to a great centrifugal force against the graphite disk, and the substrate is prone to deformation and warping, which introduces a high stress, and leads to a decrease in the mechanical strength of the substrate, thereby cracking in consequences.

In the prior art, modulation of epitaxial layer materials is performed to reduce the stress. However, due to a limitation of the properties of the material itself, an improvement of the method is not large and a crystal quality of the epitaxial layer is easily reduced, lead to a decrease in device performance. And a stronger pre-reaction can be caused by reducing a rotational speed of the graphite disk to reduce a centrifugal force, so that a growth rate is reduced, pre-reaction particles are increased, and a morphology of the epitaxial layer is deteriorated, thereby increasing production costs while not ensuring the growth quality. In addition, in the prior art, a shape of a bearing groove of the graphite disk can also be designed to reduce a stress on the substrate and the graphite disk; however, the method requires matching different shapes for different the substrates, thereby significantly increasing research and development costs and reducing universality.

SUMMARY

To solve the above technical problems, the present disclosure is disclosed. The embodiments of the present disclosure provide a semiconductor structure, including: a support structure, and a first dielectric layer and a growth substrate sequentially formed on the support structure, where a gravity center of the support structure and a gravity center of the growth substrate are disposed in a staggered manner.

Further, in a horizontal direction, a size of the support structure is not less than a size of the growth substrate.

Further, in the horizontal direction, the size of the support structure is greater than the size of the growth substrate, and the growth substrate is entirely located above the support structure.

Further, a sidewall of the support structure and/or a sidewall of the growth substrate are provided with a chamfer.

Further, the support structure includes a support substrate and a second dielectric layer wrapped on a surface of the support substrate.

Further, a hardness of the second dielectric layer is less than a hardness of the support substrate.

Further, the semiconductor structure further includes a third dielectric layer disposed on a sidewall of the growth substrate.

Further, a hardness of the third dielectric layer is less than a hardness of the growth substrate.

Further, a width, along a direction of the support structure towards the growth substrate, of the support structure gradually decreases or increases first and then decreases.

Further, materials of the support structure include one or more of Si, AlN, $Al_2O_3$, SiC, or ceramics.

Further, a thickness of the support structure is less than 3 times a thickness of the growth substrate.

Further, in a horizontal direction, a size of the support structure is greater than 1.2 times a size of the growth substrate.

Further, the support structure and the growth substrate include a defect, and a defect density of the support structure is greater than a defect density of the growth substrate.

Further, a hardness of the support structure is greater than a hardness of the growth substrate.

Further, a thermal expansion coefficient of the support structure is less than a thermal expansion coefficient of the growth substrate.

According to the semiconductor structure provided by the present disclosure, a support structure is formed at the bottom of a growth substrate, so that a mechanical strength of the semiconductor structure can be effectively improved, a stability can be enhanced, and a probability of fragmentation can be reduced by suppressing deformation; a first dielectric layer is disposed between the support structure and the growth substrate, so that defects in the support structure can be effectively prevented from extending upwards into the growth substrate, thereby improving a quality of the growth substrate and reducing a possibility of cracking during subsequent processes; and a gravity center of the support structure and a gravity center of the growth substrate disposed in a staggered manner avoid direct contact between the growth substrate and a graphite disk, transferring a centrifugal force on the growth substrate exerted by the graphite disk to the support structure, so that the quality of the growth substrate can be ensured, and a probability of cracking can be significantly reduced, thereby ensuring a crystal quality of a subsequent epitaxial layer.

BRIEF DESCRIPTION OF THE DRAWINGS

The above and other purposes, features, and advantages of the present disclosure would become more apparent by providing, with reference to the drawings, a more detailed description of embodiments of the present disclosure. The drawings provide a further understanding of the embodiments of the present disclosure and constitute a part of the specification. Together with the embodiments of the present disclosure, they are used to explain the disclosure and are not constitute a limitation on the present disclosure. In the drawings, the same reference numerals usually represent the same components.

DETAILED DESCRIPTION OF THE EMBODIMENTS

The following clearly and completely describes the technical solutions in the embodiments of the present disclosure with reference to the accompanying drawings of the embodiments of the present disclosure. Apparently, the described embodiments are only some rather than all of the embodiments of the present disclosure. All other embodiments obtained by those skilled in the art based on the embodiments of the present disclosure without creative efforts fall within the protection scope of the present disclosure.

Embodiment 1

Figure 1:
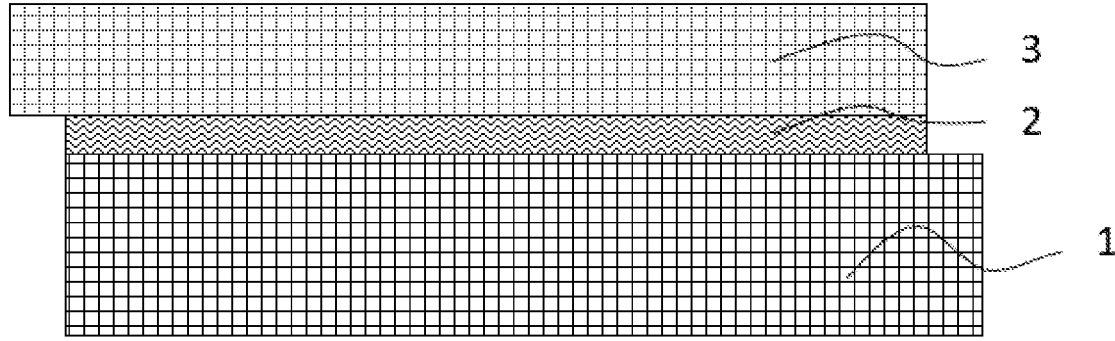
FIG. 1 is a schematic structural diagram of Embodiment 1 according to the present disclosure.

FIG. 1 is a schematic structural diagram of Embodiment 1 according to the present disclosure. As shown in FIG. 1, a semiconductor structure is provided by the Embodiment 1, and the semiconductor structure includes a support structure 1, and a first dielectric layer 2 and a growth substrate 3 sequentially formed on the support structure 1, where a gravity center of the support structure 1 and a gravity center of the growth substrate 3 are disposed in a staggered manner.

According to the semiconductor structure provided by the embodiment, the support structure 1 and the growth substrate 3 are not concentrically bonded, and the support structure 1 is formed at the bottom of the growth substrate 3, so that a mechanical strength of the semiconductor structure can be effectively improved, a stability can be enhanced, and a probability of fragmentation can be reduced by suppressing deformation. The semiconductor structure of the embodiment is placed in a graphite disk. Preferably, a part of the support structure 1, not covered by the growth substrate 3, is located on a side far from the center of the graphite disk, that is, the side that the graphite disk applies centripetal force to the semiconductor structure, so that a quality of the growth substrate 3 can be further ensured.

Figure 2:
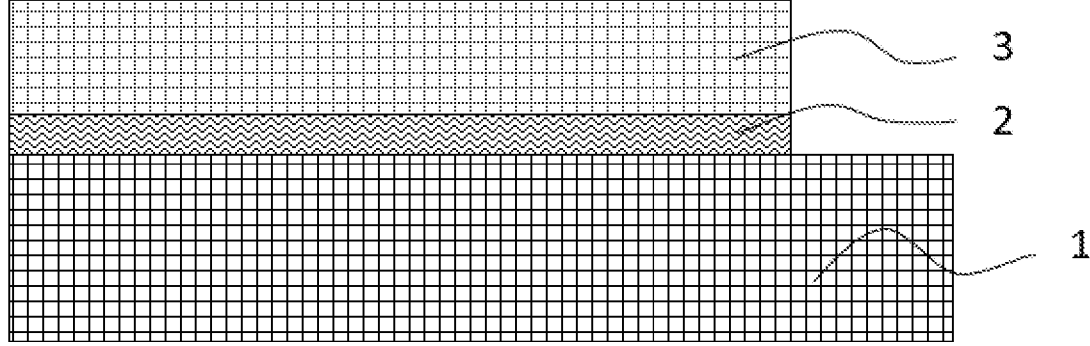
FIG. 2 is another schematic structural diagram of Embodiment 1 according to the present disclosure.

The first dielectric layer 2 is disposed between the support structure 1 and the growth substrate 3, so that defects in the support structure 1 can be effectively prevented from extending upwards into the growth substrate 3, thereby improving the quality of the growth substrate 3 and reducing a possibility of cracking during subsequent processes. Further, a size of the growth substrate 3 and a size of the support structure 1 are the same or different. Preferably, in a horizontal direction, the size of the growth substrate 3 is less than the size of the support structure 1. The direct contact between the growth substrate 3 and the graphite disk can be avoided by setting the size of support structure 1 greater than the size of growth substrate 3, transferring a centrifugal force on the growth substrate 3 exerted by the graphite disk to the support structure 1, so that the quality of the growth substrate 3 can be further ensured, and the probability of cracking can be significantly reduced, thereby ensuring a crystal quality of the subsequent epitaxial layer. Further referring to FIG. 2, when the size of the growth substrate 3 is less than the size of the support structure 1, the growth substrate 3 is entirely located above the support structure 1, so as to avoid the situation that only the growth substrate 3 is connected to the graphite disk, and a possibility of damage to the growth substrate 3 is reduced.

As a preferred implementation scheme, a hardness of the support structure 1 is greater than a hardness of the growth substrate 3, so that the mechanical strength of the growth substrate 3 can be further improved, and deformation and warping can be suppressed.

Further, a thermal expansion coefficient of the support structure 1 is less than a thermal expansion coefficient of the growth substrate 3, so that the deformation, caused by the temperature, on the growth substrate 3 can be effectively slowing down during the epitaxial process, thereby improving the crystal quality of the epitaxial layer.

Preferably, a thickness of the support structure 1 is greater than a thickness of the growth substrate 3, and the thickness of the support structure 1 is less than 3 times the thickness of the growth substrate 3.

Preferably, in the horizontal direction, the size of the support structure 1 is 20% greater than the size of the growth substrate 3 to ensure isolation between the growth substrate 3 and a sidewall of the graphite disk.

According to the embodiment, materials of the support structure 1 include one or more of Si, AlN, $Al_2O_3$, SiC, or ceramics; materials of the first dielectric layer 2 include one or more of $SiO_2$, AlN, $Al_2O_3$, SiN, or Poly Si; and materials of the growth substrate 3 include one or more of Si, AlN, $Al_2O_3$, or SiC.

Embodiment 2

Figure 3:
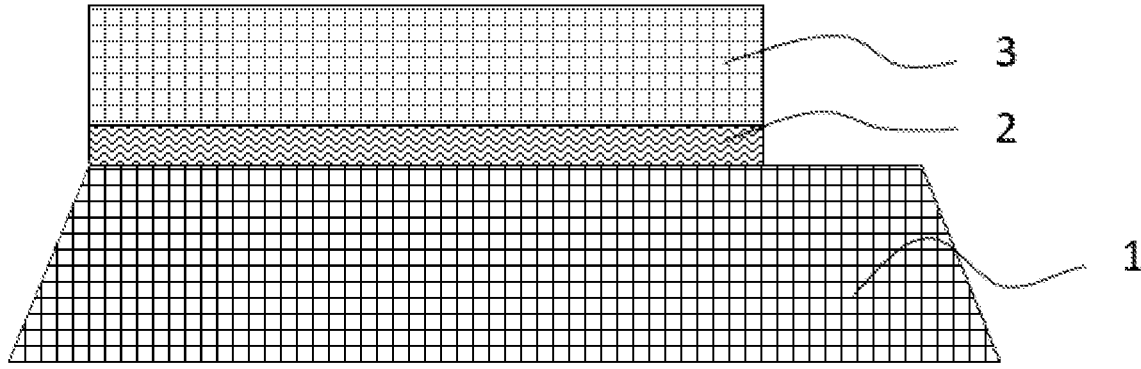
FIG. 3 is a schematic structural diagram of Embodiment 2 according to the present disclosure.
Figure 4:
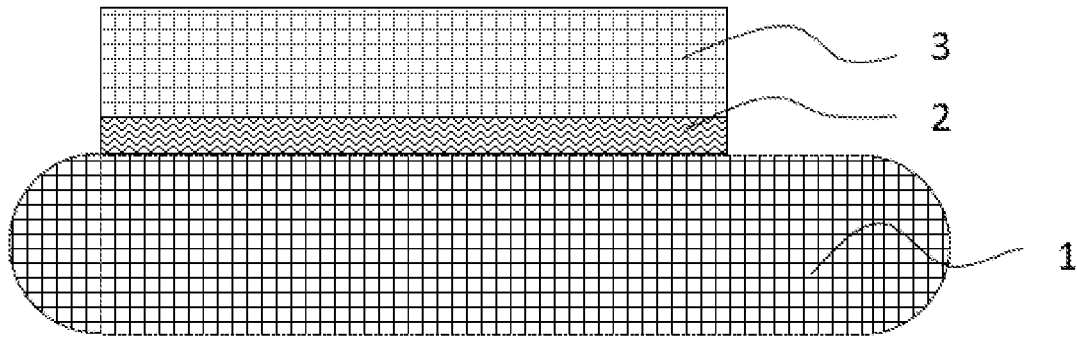
FIG. 4 is another schematic structural diagram of Embodiment 2 according to the present disclosure.

The content of Embodiment 2 is substantially the same as that of Embodiment 1, with the only difference being that, as shown in FIGS. 3 and 4, FIGS. 3 and 4 are schematic structural diagrams of Embodiment 2 according to the present disclosure. The width, along a direction of the support structure 1 towards the growth substrate 3, of the support structure 1 gradually decreases or increases first and then decreases. The sidewall of the support structure 1 may be an inclined sidewall or curved arc-shaped sidewall, and a sidewall shape of the support structure 1 is not limited in the embodiment, and only a maximum width of the support structure 1 is greater than the growth substrate 3. Preferably, the width of the surface, near the growth substrate 3, of the support structure 1 is greater than the width of the growth substrate 3, so that a stability of the growth substrate 3 can be ensured.

Embodiment 3

Figure 5:
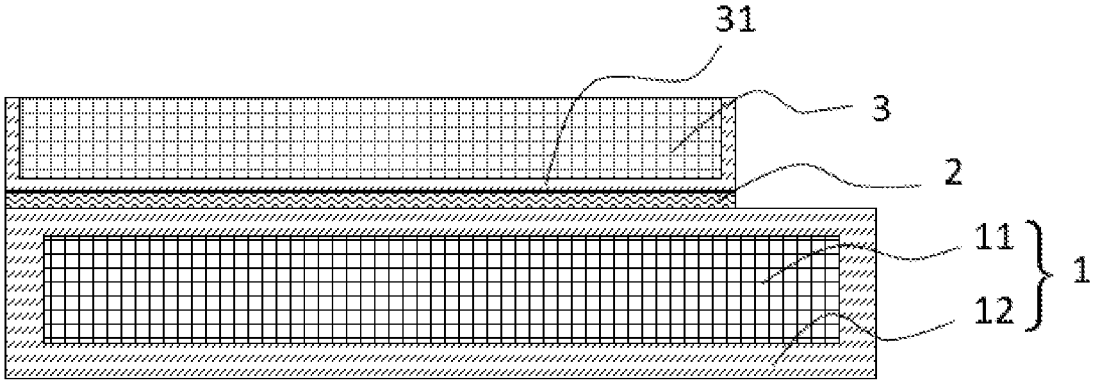
FIG. 5 is a schematic structural diagram of Embodiment 3 according to the present disclosure.

The content of Embodiment 3 is substantially the same as that of Embodiments 1 and 2, with the only difference being that, as shown in FIG. 5, the support structure 1 includes a support substrate 11 and a second dielectric layer 12 wrapped on a surface of the support substrate 11. The second dielectric layer 12 is formed on the surface of the support substrate 11 to provide a buffering protection to the support substrate 11, and to prevent the support substrate 11 from cracking caused by a centrifugal force of a graphite disk.

A material of the second dielectric layer 12 and a material of the first dielectric layer 2 are the same or different. The materials of the second dielectric layer 12 include one or more of $SiO_2$, AlN, $Al_2O_3$, SiN, or Poly Si. Further, a hardness of the second dielectric layer 12 is less than a hardness of the support substrate 11 to enhance the buffering protection to the support substrate 11.

Materials of the support substrate 11 include one or more of Si, AlN, Al$_2$O$_3$, SiC, or ceramics.

Further, the semiconductor structure further includes a third dielectric layer 31 disposed on the sidewall of the growth substrate 3, and the third dielectric layer 31 may be formed on the sidewall of the growth substrate 3 and the surface, near the support structure 1, of the growth substrate 3. A material of the third dielectric layer 31 and a material of the second dielectric layer 12 are the same or different. The materials of the third dielectric layer 31 include one or more of SiO$_2$, AlN, Al$_2$O$_3$, SiN, or Poly Si. Further, a hardness of the third dielectric layer 31 is less than a hardness of the growth substrate 3 to enhance the buffering protection to the growth substrate 3.

Embodiment 4

Figure 6:
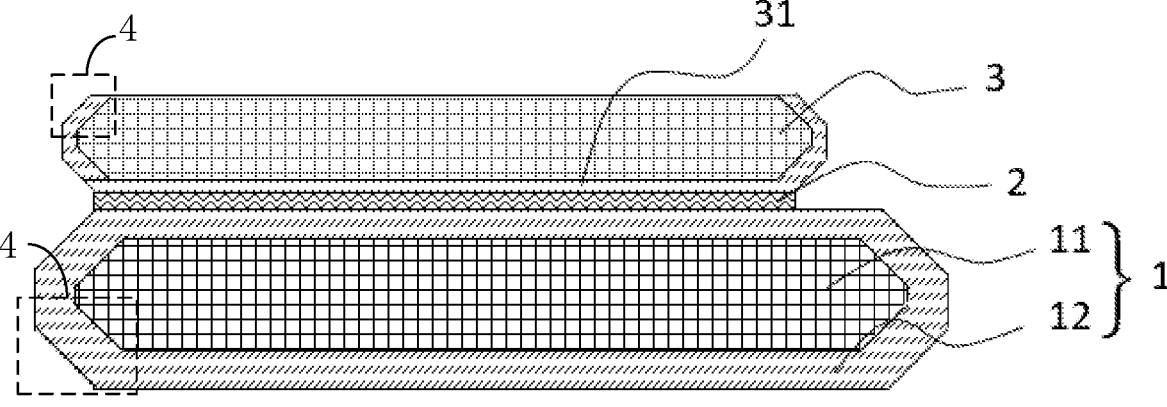
FIG. 6 is a schematic structural diagram of Embodiment 4 according to the present disclosure.

The content of Embodiment 4 is substantially the same as that of Embodiments 1 to 3, with the only difference being that, as shown in FIG. 6, a sidewall of the support structure and a sidewall of the growth substrate are provided with a chamfer 4 to reduce a contact area between the sidewall of the substrate and a graphite disk, thereby reducing the re-melting phenomenon of the sidewall of the substrate, improving the crystal quality of the epitaxial layer above the edge of the substrate, and further avoiding the cracking on the sidewall of the substrate caused by uneven stress. The chamfer 4 may be formed into any shape such as a trapezoid or arc, which may reduce the contact area between the sidewall of the substrate and the graphite disk.

According to another embodiment, the chamfer 4 may also be disposed only on the support structure 1 or the sidewall of the growth substrate 3. Disposing the chamfer 4 on the support structure 1 can avoid cracking in the support structure 1 and ensure a quality of the growth substrate 3. Disposing the chamfer 4 on the sidewall of the growth substrate 3 may avoid cracking and improve a crystal quality of an epitaxial layer on the edge of the growth substrate 3.

The above describes the basic principles of the present disclosure with specific embodiments. However, it should be noted that the advantages, advantages, effects, and so on mentioned in the present disclosure are only examples but not limitations, and cannot be considered essential for each embodiment of the present disclosure. In addition, the specific details disclosed above are only to provide examples and facilitate understanding, not limitation. The above details do not limit the necessity of using the above specific details to achieve the present disclosure.

The above description has been provided for illustration and description. Furthermore, this description is not intended to limit the embodiments of the present disclosure to the form disclosed herein. Although several exemplary aspects and embodiments discussed above, those skilled in the art will recognize certain variations, modifications, changes, additions, and sub-combinations thereof

What is claimed is:

1. A semiconductor structure, comprising:
a support structure, and a first dielectric layer and a growth substrate sequentially formed on the support structure, wherein a gravity center of the support structure and a gravity center of the growth substrate are disposed in a staggered manner, wherein the support structure and the growth substrate comprise a defect, and a defect density of the support structure is greater than a defect density of the growth substrate.

2. The semiconductor structure according to claim 1, wherein in a horizontal direction, a size of the support structure is not less than a size of the growth substrate.

3. The semiconductor structure according to claim 2, wherein in the horizontal direction, the size of the support structure is greater than the size of the growth substrate, and the growth substrate is entirely located above the support structure.

4. The semiconductor structure according to claim 1, wherein a sidewall of the support structure and/or a sidewall of the growth substrate are provided with a chamfer.

5. The semiconductor structure according to claim 1, wherein the support structure comprises a support substrate and a second dielectric layer wrapped on a surface of the support substrate.

6. The semiconductor structure according to claim 5, wherein a hardness of the second dielectric layer is less than a hardness of the support substrate.

7. The semiconductor structure according to claim 1, wherein the semiconductor structure further comprises a third dielectric layer disposed on a sidewall of the growth substrate.

8. The semiconductor structure according to claim 7, wherein a hardness of the third dielectric layer is less than a hardness of the growth substrate.

9. The semiconductor structure according to claim 1, wherein a width, along a direction of the support structure towards the growth substrate, of the support structure gradually decreases or increases first and then decreases.

10. The semiconductor structure according to claim 1, wherein materials of the support structure comprise one or more of Si, AlN, Al$_2$O$_3$, SiC, or ceramics.

11. The semiconductor structure according to claim 1, wherein a thickness of the support structure is less than 3 times a thickness of the growth substrate.

12. The semiconductor structure according to claim 1, wherein in a horizontal direction, a size of the support structure is greater than 1.2 times a size of the growth substrate.

13. The semiconductor structure according to claim 1, wherein a hardness of the support structure is greater than a hardness of the growth substrate.

14. The semiconductor structure according to claim 1, wherein a thermal expansion coefficient of the support structure is less than a thermal expansion coefficient of the growth substrate.

15. The semiconductor structure according to claim 11, wherein a thickness of the support structure is greater than a thickness of the growth substrate.

* * * * *